United States Patent
Tu et al.

(10) Patent No.: US 9,711,374 B2
(45) Date of Patent: Jul. 18, 2017

(54) MECHANISMS FOR FORMING OXIDE LAYER OVER EXPOSED POLYSILICON DURING A CHEMICAL MECHANICAL POLISHING (CMP) PROCESS

(71) Applicant: Taiwan Semiconductor Manufacturing Co., Ltd., Hsin-Chu (TW)

(72) Inventors: Che-Hao Tu, Hsinchu (TW); Chih-Yu Chang, Zhongli (TW); William Weilun Hong, Hsinchu (TW); Ying-Tsung Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 139 days.

(21) Appl. No.: 13/916,827

(22) Filed: Jun. 13, 2013

(65) Prior Publication Data

US 2014/0370696 A1   Dec. 18, 2014

(51) Int. Cl.
*H01L 21/3205* (2006.01)
*H01L 21/4763* (2006.01)
(Continued)

(52) U.S. Cl.
CPC .... *H01L 21/3212* (2013.01); *H01L 21/02065* (2013.01); *H01L 21/02074* (2013.01);
(Continued)

(58) Field of Classification Search
CPC ........... H01L 21/7684; H01L 21/76877; H01L 21/76819; H01L 21/32115; H01L 21/32134; H01L 21/3212; H01L 21/32139; H01L 29/6659; H01L 21/28123; H01L 27/1214; H01L 51/0545; H01L 27/12
(Continued)

(56) References Cited

U.S. PATENT DOCUMENTS 6,099,662 A * 8/2000 Wang ................ H01L 21/02065
134/26
6,383,882 B1 * 5/2002 Lee .................... H01L 21/28052
257/E21.199
(Continued)

FOREIGN PATENT DOCUMENTS

CN            102623308 A  *  8/2012

*Primary Examiner* — Thao X Le
*Assistant Examiner* — Nduka Ojeh
(74) *Attorney, Agent, or Firm* — Birch, Stewart, Kolasch & Birch, LLP

(57) ABSTRACT

Embodiments of cleaning a surface of a polysilicon layer during a chemical mechanical polishing (CMP) process are provided. The method includes providing a substrate, and forming a gate structure on the substrate, and the gate structure includes a polysilicon layer. The method further includes forming an inter-layer dielectric layer (ILD) over the gate structure. The method also includes performing a CMP process to planarize the inter-layer dielectric layer (ILD) and to expose the polysilicon layer, and the CMP process includes: providing an oxidation solution to a surface of the substrate to perform an oxidation operation to form an oxide layer on the polysilicon layer; and providing a cleaning solution to the surface of the substrate to perform a cleaning operation.

20 Claims, 11 Drawing Sheets

(51) Int. Cl.
*H01L 21/302* (2006.01)
*H01L 21/461* (2006.01)
*H01L 21/321* (2006.01)
*H01L 21/02* (2006.01)
*H01L 21/3105* (2006.01)
*H01L 29/66* (2006.01)

(52) U.S. Cl.
CPC .. *H01L 21/31053* (2013.01); *H01L 21/32105* (2013.01); *H01L 29/66545* (2013.01)

(58) Field of Classification Search
USPC ...... 438/585, 645, 631, 626, 697, FOR. 163, 438/FOR. 423; 257/752, E21.206, 257/E21.243, E21.303, E21.583, E51.005
See application file for complete search history.

(56) References Cited

U.S. PATENT DOCUMENTS

| | | | |
|---|---|---|---|
| 7,754,558 B1* | 7/2010 | Mitra et al. | 438/210 |
| 2002/0187731 A1* | 12/2002 | Chen et al. | 451/36 |
| 2007/0152252 A1* | 7/2007 | Buehler | H01L 21/02074 257/295 |
| 2008/0206973 A1* | 8/2008 | Johnson | H01L 21/26506 438/585 |
| 2011/0318929 A1* | 12/2011 | Mishima et al. | 438/693 |
| 2012/0286337 A1* | 11/2012 | Liang et al. | 257/288 |
| 2012/0315762 A1* | 12/2012 | Jiang et al. | 438/692 |
| 2013/0065326 A1* | 3/2013 | Sudo | H01L 27/228 438/3 |
| 2013/0105912 A1* | 5/2013 | Hsu et al. | 257/379 |

* cited by examiner

US 9,711,374 B2

MECHANISMS FOR FORMING OXIDE LAYER OVER EXPOSED POLYSILICON DURING A CHEMICAL MECHANICAL POLISHING (CMP) PROCESS

BACKGROUND

The semiconductor integrated circuit (IC) industry has experienced exponential growth. Technological advances in IC design and material have produced generations of ICs where each generation has smaller and more complex circuits than previous generations. In the course of IC evolution, functional density (i.e., the number of interconnected devices per chip area) has generally increased while geometric size (i.e., the smallest component (or line) that can be fabricated) has decreased.

A chemical mechanical polishing (CMP) process is used in the fabrication of ICs. As an IC is built up layer by layer from a surface of a semiconductor wafer, the CMP process is used to planarize the uppermost layer or layers to provide a leveled surface for fabrication.

There are challenges in fabricating of advanced integrated circuit (IC) involving CMP process.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1A:
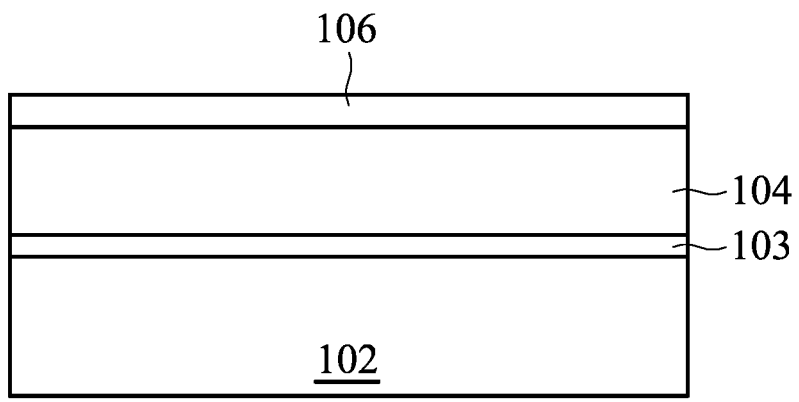
FIGS. 1A-1J show cross-sectional and schematic representations of various stages of forming a semiconductor device structure using a CMP process in accordance with some embodiments of the disclosure.

FIG. 1A-1I show cross-sectional and schematic representations of various stages of forming a semiconductor device structure using a chemical mechanical polishing (CMP) process. Referring to FIG. 1A, a dielectric layer 103 is formed on a substrate 102, and a polysilicon layer 104 is formed on the dielectric layer 103. In some embodiments, the substrate 102 may include silicon. Alternatively or additionally, the substrate 102 may include other elementary semiconductor materials such as germanium. The substrate 102 may be made of a compound semiconductor such as silicon carbide, gallium arsenic, indium arsenide, or indium phosphide. In some embodiments, the substrate 102 may be made of an alloy semiconductor such as silicon germanium, silicon germanium carbide, gallium arsenic phosphide, or gallium indium phosphide. In some embodiments, the substrate 102 is made of an epitaxial layer. For example, the substrate 102 has an epitaxial layer overlying a bulk semiconductor. Furthermore, the substrate 102 may include a semiconductor-on-insulator (SOI) structure.

The substrate 102 may include various isolation features (not shown). The isolation features separate various device regions in the substrate 102. The isolation features include different structures formed by using different processing technologies. For example, the isolation features includes shallow trench isolation (STI) features. The formation of the STI features may include etching a trench in the substrate 102 and filling in the trench with insulator materials such as silicon oxide, silicon nitride, or silicon oxynitride.

The dielectric layer 103 may be made of silicon oxide, silicon oxynitride, a high dielectric constant material (high-k material), and/or combinations thereof. The high dielectric constant material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The dielectric layer 103 may be formed by any suitable process, such as atomic layer deposition (ALD), chemical vapor deposition (CVD), physical vapor deposition (PVD), remote plasma CVD (RPCVD), plasma enhanced CVD (PECVD) or other suitable processes or combinations thereof.

In some embodiments, the polysilicon layer 104 may be formed by a chemical vapor deposition (CVD) method or other suitable processes. In some embodiments, more than one layer (not shown) may be formed between the substrate 102 and the polysilicon layer 104.

Afterwards, a hard mask layer 106 is formed on the polysilicon layer 104. The hard mask layer 106 is used to assist patterning the dielectric layer 103 and the polysilicon layer 104. The hard mask layer 106 may be made of $SiO_2$, Si$_3$N$_4$ or SiON. The hard mask layer 106 may be formed by a suitable process, such as a chemical vapor deposition (CVD), and a patterning method.

Figure 1B:
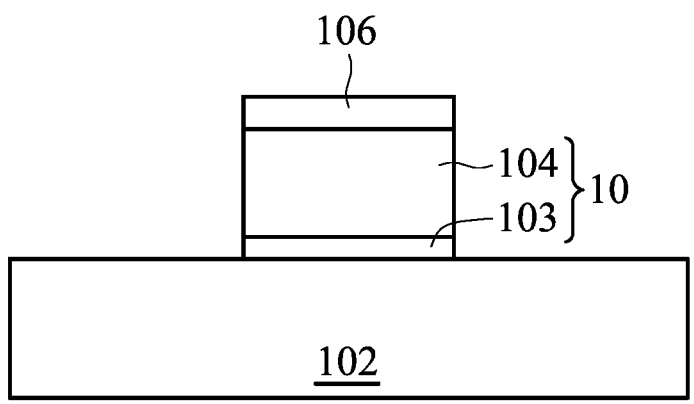

Referring to FIG. 1B, the dielectric layer 103 and the polysilicon layer 104 are patterned to form a gate structure 10 and are assisted by using the hard mask layer 106 as an etching mask by a photolithography process and an etching process. An exemplary photolithography process may include the processing steps of photoresist coating, soft baking, mask aligning, exposing, post-exposure baking, developing photoresist and hard baking. The photolithography exposing process may also be implemented or replaced by other methods such as maskless photolithography, electron-beam writing, ion-beam writing, and molecular imprinting. The etching process may include a dry etching process, a wet etching process or combinations thereof.

Figure 1C:
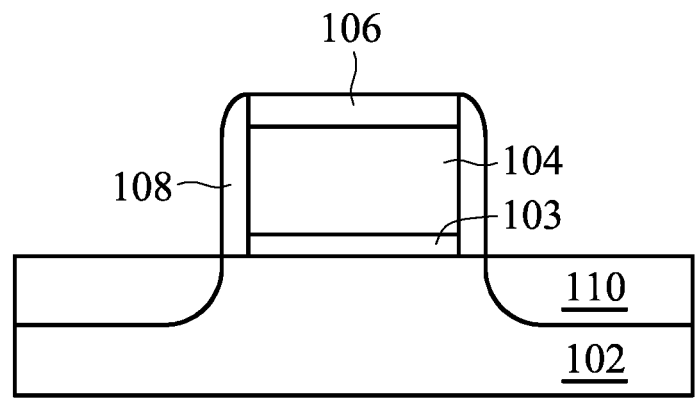

Referring to FIG. 1C, spacers 108 are formed on sidewalls of the gate structure 10. The spacers 108 may be made of a dielectric layer, such as a silicon nitride layer, a silicon oxynitride layer or combinations thereof. The spacers 108 are deposited on the gate structure 10 and the substrate 102 by using a suitable process, such as a CVD process, and then etched by using an etching process, such as a dry etching process, to have the structure shown in FIG. 1C. However, the spacers 108 may be of other configurations and may involve multiple layers.

A source/drain region (S/D) 110 may be formed in the substrate 102 adjacent to the gate structure 10 after the spacers 108 are formed. The source/drain region (S/D) 110 may be formed by implanting p-type or n-type dopants or impurities into the substrate 102, depending on the configuration of the transistors.

Figure 1D:
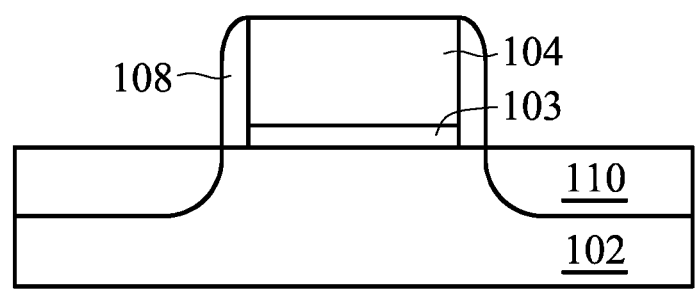

Referring to FIG. 1D, the hard mask layer 106 is removed by an etching process, such as a dry etching process, a wet etching process or combinations thereof, to expose the polysilicon layer 104. In another embodiment, the hard mask layer 106 is removed by a CMP process.

Figure 1E:
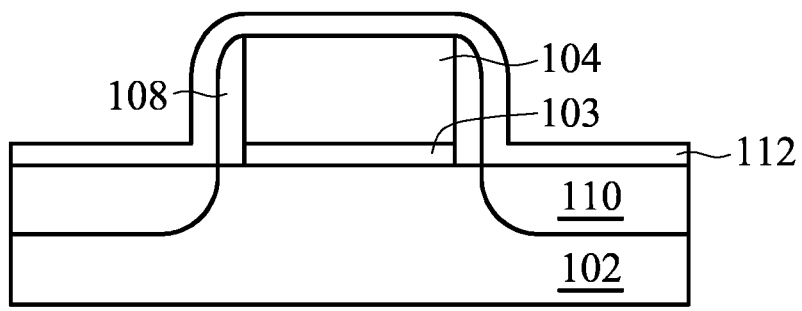

Referring to FIG. 1E, a contact etch stop layer (CESL) 112 is formed on the gate structure 10, the substrate 102 and the spacers 108. The contact etch stop layer 112 may be made of a silicon nitride layer. The thickness of the contact etch stop layer 112 is in a range from about 30 Å to about 250 Å. The contact etch stop layer 112 may be formed by using a suitable process, such as a CVD process. In some embodiments, the contact etch stop layer (CESL) 112 may not be formed.

Figure 1F:
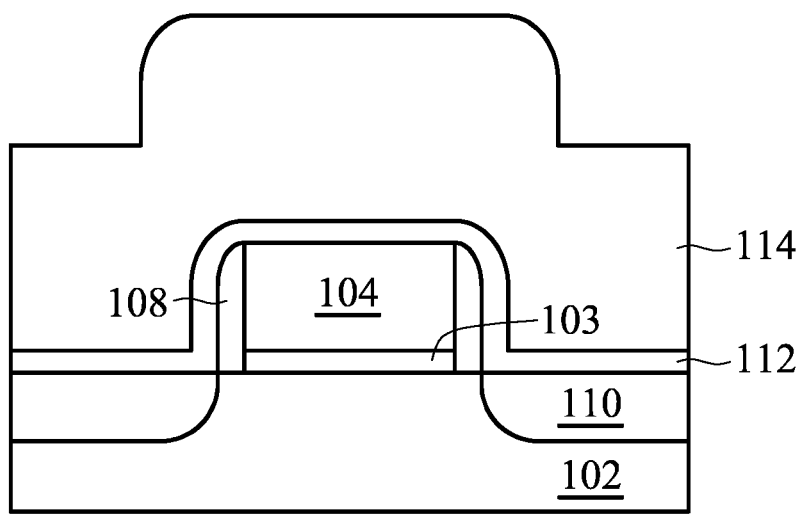

Referring to FIG. 1F, an inter-layer dielectric (ILD) layer 114 is formed on the contact etch stop layer 112. The ILD layer 114 may be one or more layers. The ILD layer 114 may be made of silicon oxide, spin-on glass (SOG), fluorinated silica glass (FSG), phosphoric silicate glass (PSG), borophosphosilicate glass (BPSG), carbon doped silicon oxide (e.g. SiCOH), polyimide, porous polymeric materials or combinations thereof. The ILD layer 114 may be formed by a deposition method, such as chemical vapor deposition (CVD), a spin on method, or a sputter method.

As shown in FIG. 1F, the ILD layer 114 has a surface topography which will be planarized by a CMP process. The CMP process may include a main CMP operation involving a hard pad and a buffing CMP operation involving a soft pad. In some embodiments, the main CMP operation is a first CMP operation which may include two operations 11a, 11b, and the buffing CMP operation is a second CMP operation 13. Note that the polishing parameters (e.g. operation time, pads, wetting solution) of the first CMP operations 11a, 11b and the second CMP operation 13 may be adjusted according to the situations occurring during actual applications.

Figure 1G:
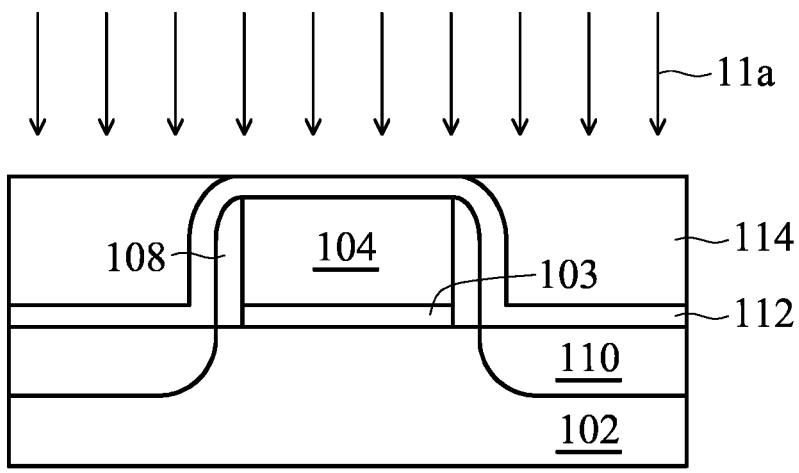
Figure 1H:
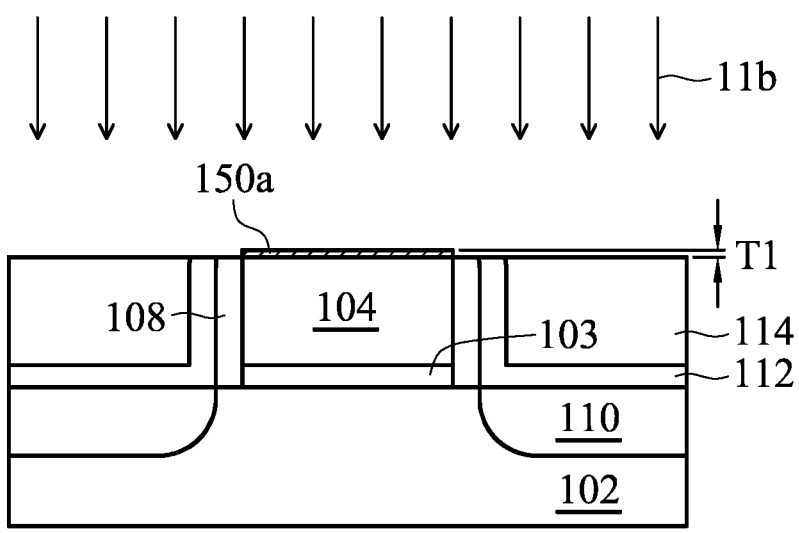

Referring to FIG. 1G, the first CMP operation 11a is performed on the inter-layer dielectric layer (ILD) 114. In some embodiments, the slurry used in the first CMP operation 11a is made of SiO$_2$, CeO$_2$, or Al$_2$O$_3$, and the slurry has a pH value in a range from about 2 to about 7.

Referring to 1H, another first CMP operation 11b is performed on the contact etch stop layer (CESL) 112 to expose the polysilicon layer 104. In some embodiments, the processing parameters of the first CMP operation 11a are different from that of the first chemical mechanical polishing (CMP) operation 11b. In some embodiments, the slurry used in the first CMP operation 11b is made of SiO$_2$, CeO$_2$, or Al$_2$O$_3$, and the slurry has a pH value in a range from about 2 to about 7.

When the polysilicon layer 104 is exposed, a native oxide layer 150a is spontaneously formed on the polysilicon layer 104. The native oxide layer 150a is a silicon oxide layer and has a thickness T1. In some embodiments, the thickness T1 is in a range from about 1 Å to about 10 Å.

Figure 2A:
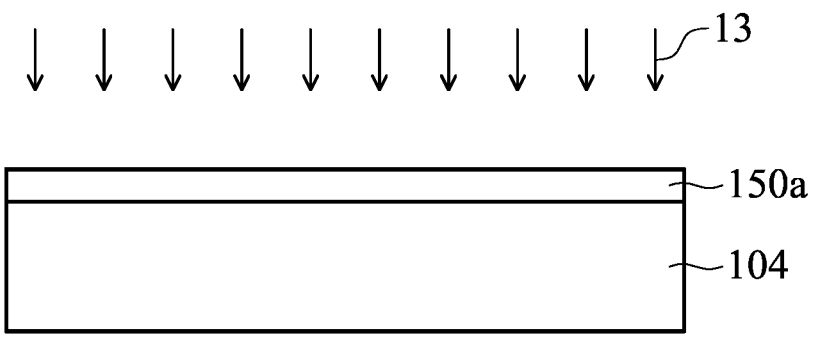
FIG. 2A shows a cross-sectional and schematic representation of a native oxide layer on a polysilicon layer in accordance with some embodiments of the disclosure.
Figure 2B:
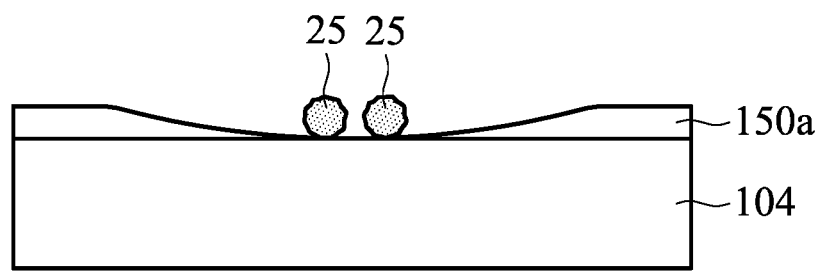
FIG. 2B show a cross-sectional and schematic representation of an etched native oxide layer and an exposed polysilicon layer in accordance with some embodiments of the disclosure.

However, the native oxide layer 150a is relatively thin and could be insufficient to protect the polysilicon layer 104 in some embodiments. FIGS. 2A-2B explain the possible contaminating problem caused when the native oxide layer 150a is too thin. FIG. 2A shows a cross-sectional and schematic representation of the native oxide layer 150a on the polysilicon layer 104. Referring to FIG. 2A, the polysilicon layer 104 is exposed after the second CMP operation 13, and the native oxide layer 150a is spontaneously formed on the polysilicon layer 104. Because the polysilicon layer 104 has a hydrophobic surface, contaminants (e.g. polish pad side product, clean brush debris, surfactant of slurry) from subsequent CMP processes are likely to adhere to the surface of the polysilicon layer 104. However, the native oxide layer 150a has a hydrophilic surface, contaminants are much less likely to adhere to the native oxide layer 150a. Therefore, the native oxide layer 150a protects the polysilicon layer 104 from being exposed to contaminants.

After the second CMP operation 13, the substrate 102 undergoes a cleaning operation. A cleaning solution used in the cleaning operation would etch the native oxide layer 150a. FIG. 2B shows a cross-sectional and schematic representation of the native oxide layer 150a and the exposed polysilicon layer 104 due to removal of a portion of the native oxide layer 150a during the CMP cleaning operation. The cleaning solution includes cleaning agents, such as halide (such as HF, HBr or HCl, or acid salt such as NaCl, NaF, or NaBr) with a concentration larger than about 5%. The cleaning solution could etch a portion of the native oxide layer 150a. The cleaning solution may also etch the polysilicon layer 104. The contaminants 25 (e.g. polish pad side product, clean brush debris, surfactant of slurry) would then adhere to the polysilicon layer 104. The contaminants 25 on the exposed polysilicon layer 104 could cause defect issue and could contaminate the processing chambers in the subsequent processes.

As mentioned above, the CMP process includes the main CMP operation and the buffing CMP operation. After the first CMP operation 11, the second CMP operation 13 is performed on surface of the substrate 102. The second CMP operation 13 may include a cleaning solution with a halide concentration larger than about 5%. The high halide concentration has a high oxide removal rate, which aggressively removes the native oxide layer 150a. In order to prevent exposure of the polysilicon layer 104, a thick oxide layer over the polysilicon layer 104 is needed. Further, the halide concentration in the cleaning solution could be lowered to reduce the oxide removal rate.

Figure 1I:
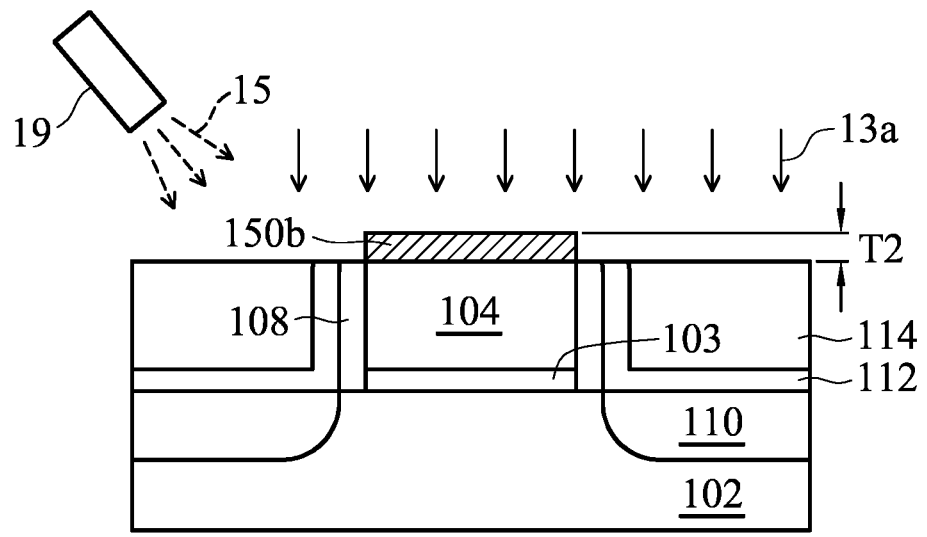
Figure 1J:
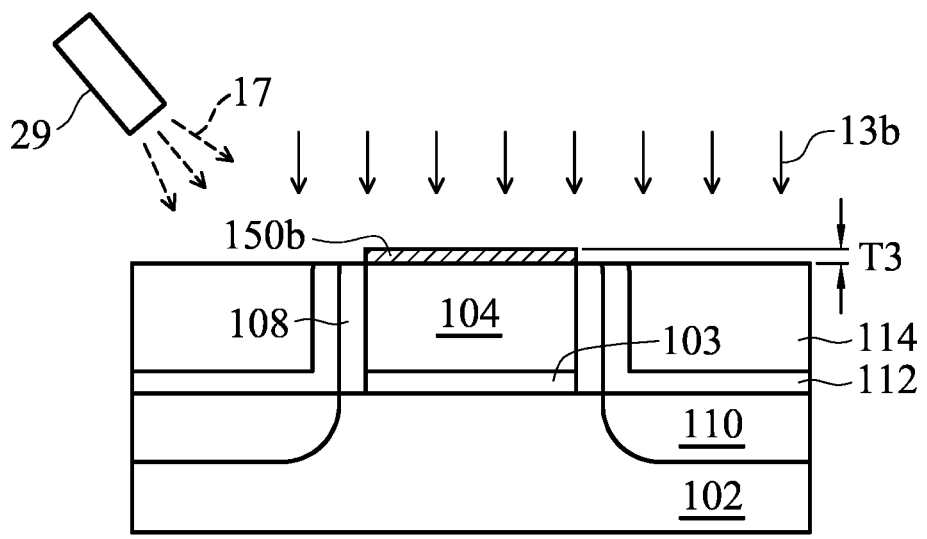

Referring to FIGS. 1I and 1J, the second CMP is broken into two operations 13a and 13b, with the operation 13a being added. In the operation 13a, an oxidation solution 15 is introduced on the surface of the substrate 102 and is in contact with the native oxide layer 150a. The oxidation solution 15 is provided from a supplier 19 (such as nozzle) to oxidize the polysilicon layer 104 to form an oxide layer 150b. The oxide layer 150b is a silicon oxide layer. The oxidation solution 15 is used to form the oxide layer 150b on the exposed polysilicon layer 104. The growth of the oxide layer 150b is enhanced by an oxidizing agent in the oxidation solution 15. As a result, the thick oxide layer 150b is designed to protect the polysilicon layer 104 from being exposed.

The thick oxide layer 150b has a thickness T2. In some embodiments, the thickness T2 is in a range from about is 15 Å to about 30 Å. In some embodiments, the percent of increase in thickness of the native oxide layer 150a after the oxidation operation increases in a range from about 10% to about 200%.

The oxidation solution 15 includes an oxidizing agent. The oxidizing agent may be made of a hydrogen peroxide ($H_2O_2$), hydroxyl amine ($NH_2OH$), $HClO$, $NaClO$, $KClO$, $Ca(OCl)_2$ or other suitable compounds. In some embodiments, the oxygen-containing gas is used as the oxidizing agent. The oxidation solution 15 is provided by supplying oxygen-containing gas, such as oxygen ($O_2$) ozone ($O_3$) or combinations thereof, into water. In some embodiments, the oxidation solution 15 is a hydrogen peroxide ($H_2O_2$) solution with a concentration in a range from about 1% to about 30%. In some embodiments, ozone ($O_3$) gas with a concentration in a range from about 1 ppm to about 15 ppm purged into water is used as the oxidation solution 15.

After the operation 13a, referring to FIG. 1J, the oxidation solution 15 is stopped and the operation 13b is started using a cleaning solution 17. The cleaning solution 17 is provided from a supplier 29 (such as nozzle) to perform a cleaning operation. In some embodiments, the cleaning solution 17 includes organic acid, halide(s), surfactants or combinations thereof. In some embodiments, in order to prevent the oxide layer 150b from being completely removed by the cleaning solution 17, the halide concentration in cleaning solution 17 is reduced to be less than about 5% to reduce the oxide removal rate. In some embodiments, the halide concentration in cleaning solution 17 is in a range from about 0.1% to about 5%. In some embodiments, the halide concentration in cleaning solution 17 is in a range from about 2% to about 3%.

After the cleaning operation, the oxide layer 150b may be slightly etched by the cleaning solution 17. Thus, the oxide layer 150b has a thickness T3 which is slightly smaller than the thickness T2. In some embodiments, the thickness T3 is in a range form about 10 Å to about 25 Å. Although the thickness of the oxide layer 150b is reduced to thickness T3, it is still thick enough to protect the polysilicon layer 104 from being exposed.

If there is a concern that the oxide layer 150b is too thin after the operation 13b, the step of FIG. 1I and steps of 1I-1J may be repeated.

Note that during the operations 13a, 13b, the oxidation solution 15 and the cleaning solution 17 are sequentially provided at the same CMP station. In other words, the oxidation operation and the cleaning operation are performed in-situ without being transporting to another station for convenience and efficiency. In some embodiments, the oxidation operation and the cleaning operation are performed ex-situ in a separate system.

From the above descriptions, the thick oxide layer 150b is formed by using the oxidation solution 15 during the operation 13a and by using the cleaning solution 17 with a halide concentration less than about 5% during the operation 13b. Afterwards, the substrate 102 can continue with further processing to form devices and the interconnect structures to complete manufacturing processes. The particle issue we mentioned above is resolved or greatly improved.

Figure 3A:
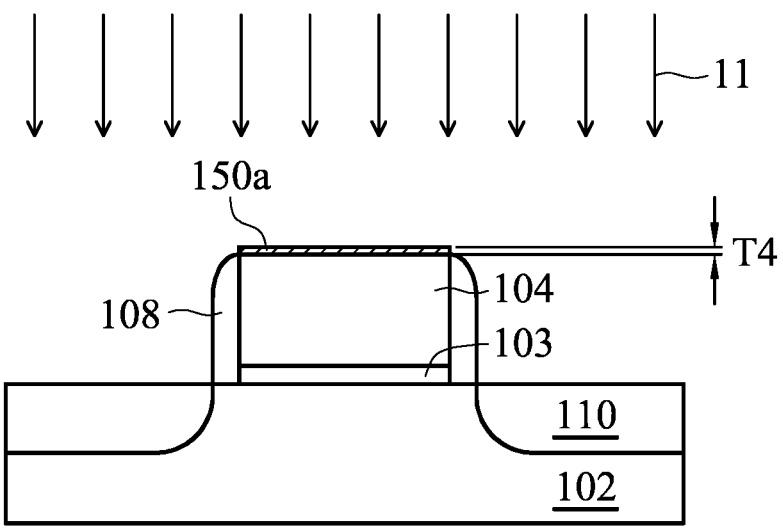
FIGS. 3A-3C show cross-sectional and schematic representations of various stages of removing a hard mask layer by a CMP process in accordance with some embodiments of the disclosure.
Figure 3B:
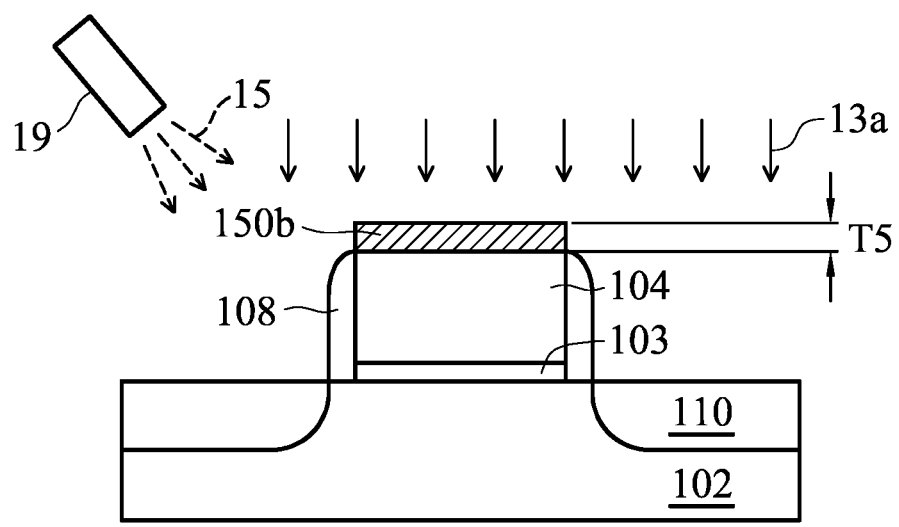
Figure 3C:
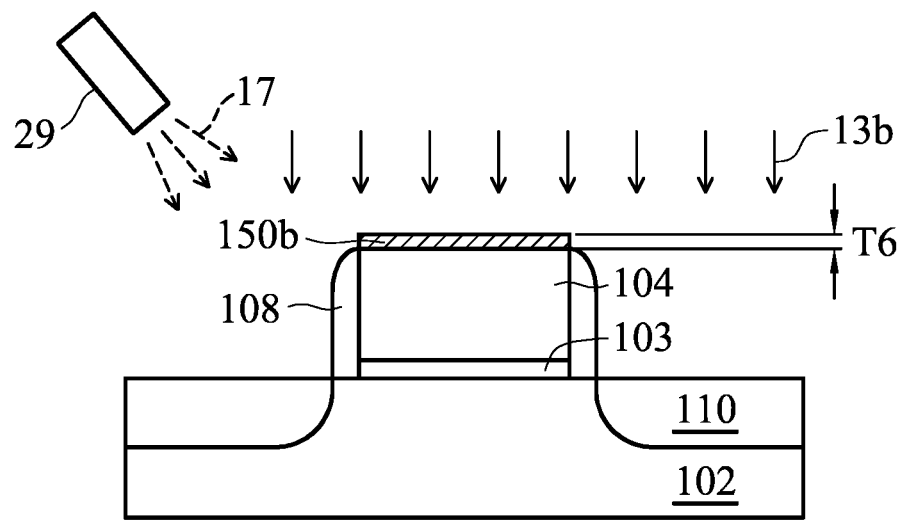

As described in FIG. 1D, the hard mask layer 106 is removed by the etching process. In some embodiments, the hard mask layer 106 is removed by the CMP process. FIGS. 3A-3C show cross-sectional and schematic representations of various stages of a method for removing the hard mask layer 106 in accordance with some embodiments of the disclosure, and like elements are identified by the same reference numbers as in FIGS. 1A-1E, and thus are not repeated for brevity.

Referring to FIG. 3A, the hard mask layer 106 is removed by the first CMP operation 11 to expose the polysilicon layer 104. When the polysilicon layer 104 is exposed, the native oxide layer 150a is spontaneously formed on a surface of the polysilicon layer 104. The native oxide layer 150a has a thickness T4 which is similar to thickness T1.

Referring to FIG. 3B, when the operation 13a is performed on the surface of the substrate 102, and the oxidation solution 15 is simultaneously provided.

The oxidation solution 15 is provided to perform the oxidation operation. The oxidation solution 15 includes the oxidizing agent. The oxidizing agent is described above, and will not be repeated for brevity.

After the oxidation operation, the oxide layer 150b is obtained with a thickness T5. In some embodiments, the thickness T5 is in a range from about 15 Å to about 30 Å. In some embodiments, the percent of increase in thickness of the native oxide layer 150a after the oxidation operation is in a range from about 10% to about 30%.

Referring to FIG. 3C, the operation 13b is performed on the surface of the substrate 102, and the oxidation solution 15 is replaced by the cleaning solution 17. Note that the halide concentration in the cleaning solution 17 is less than about 5%. In some embodiments, the halide concentration is in a range from about 0.1% to about 5%. In some embodiments, the halide concentration is in a range from about 2% to about 3%.

After the cleaning operation, the oxide layer 150b may be slightly etched by the cleaning solution 17. Thus, the oxide layer 150b has a thickness T6 which is slightly smaller than the thickness T5. The thickness T6 is still thick enough to protect the polysilicon layer 104 from being exposed.

FIGS. 4A-4D show cross-sectional and schematic representations of various stages for forming an oxide layer over a FinFET (Fin field effect transistor) device structure during a CMP process in accordance with some embodiments of the disclosure. The like elements in FIGS. 4A-4D are identified by the same reference numbers as in FIGS. 1A-1E, and are not repeated for brevity.

Figure 4A:
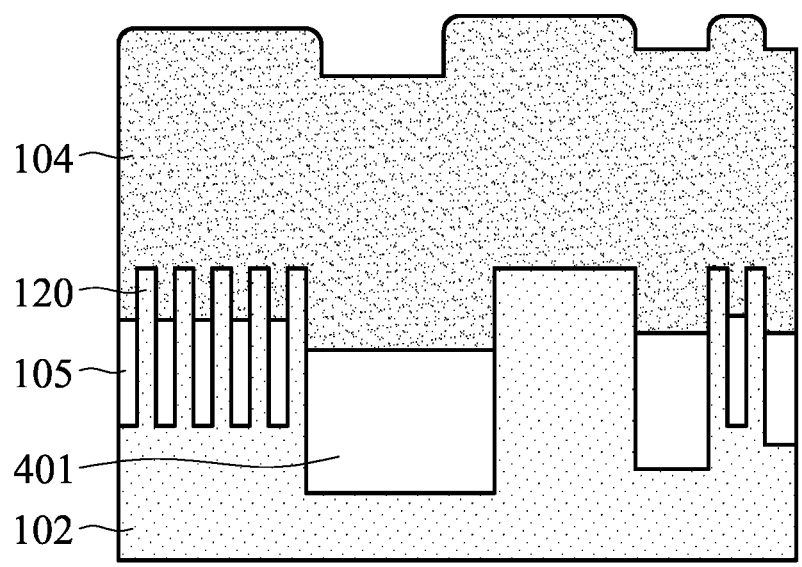
FIGS. 4A-4D show cross-sectional and schematic representations of various stages for forming an oxide layer over a FinFET device structure in accordance with some embodiments of the disclosure.

Referring to FIG. 4A, the substrate 102 has fin structures 120, and the insulating layer 105, a dielectric layer 401 and the polysilicon layer 104 are formed over the fin structures 120. Since the fin structures 120 are formed, portions of the insulating layer 105 and the dielectric layer 401 on the fin structures 120 have a surface topography. Thus, the polysilicon layer 104 formed on the insulating layer 105 and the dielectric layer 401 also has a surface topography.

Figure 4B:
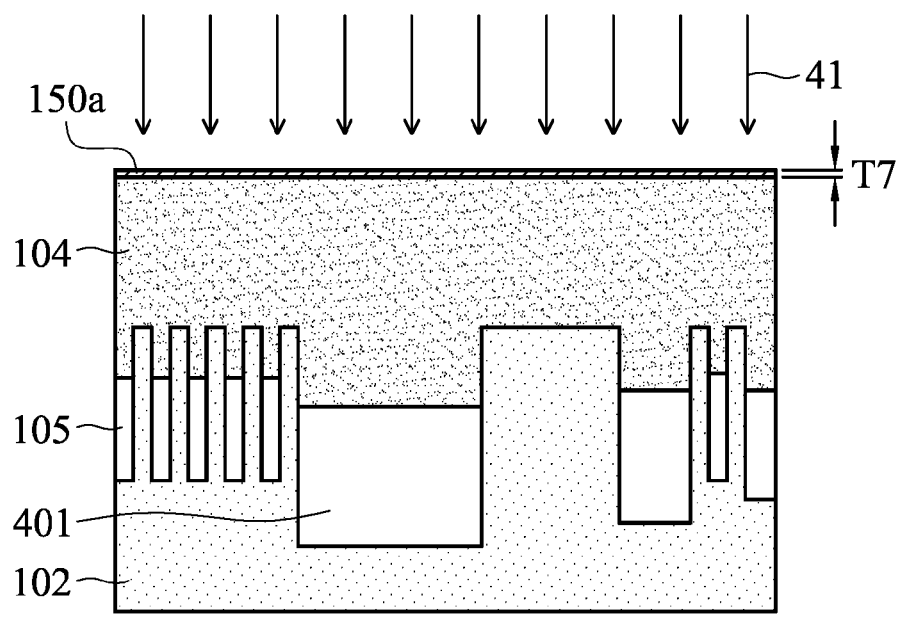

Referring to FIG. 4B, in order to planarize the uneven polysilicon layer 104, a first CMP operation 41 is performed on the surface of the polysilicon layer 104. The native oxide layer 150a is then spontaneously formed on the polysilicon layer 104 and has a thickness T7 in a range from 1 Å to about 10 Å. The slurry used in the first CMP operation 41 could be different from that in first CMP operation 11.

Figure 4C:
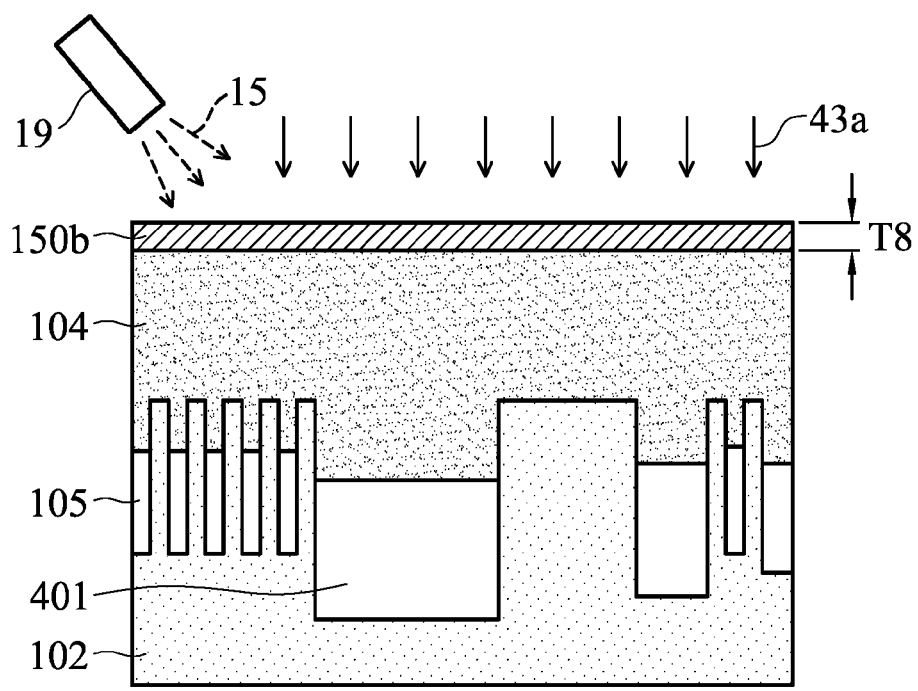

Referring to FIG. 4C, the second chemical mechanical polishing (CMP) is broken into two operations 43a and 43b which is similar to operations 13a,13b. The operation 43a is performed on the surface of the polysilicon layer 104. The operation 43a is a buffing CMP which includes the oxidation solution 15, which has been described above, and not repeated here. After providing the oxidation solution 15, the oxide layer 150b is formed and has a thickness T8 in a range from about 15 Å to about 30 Å.

Figure 4D:
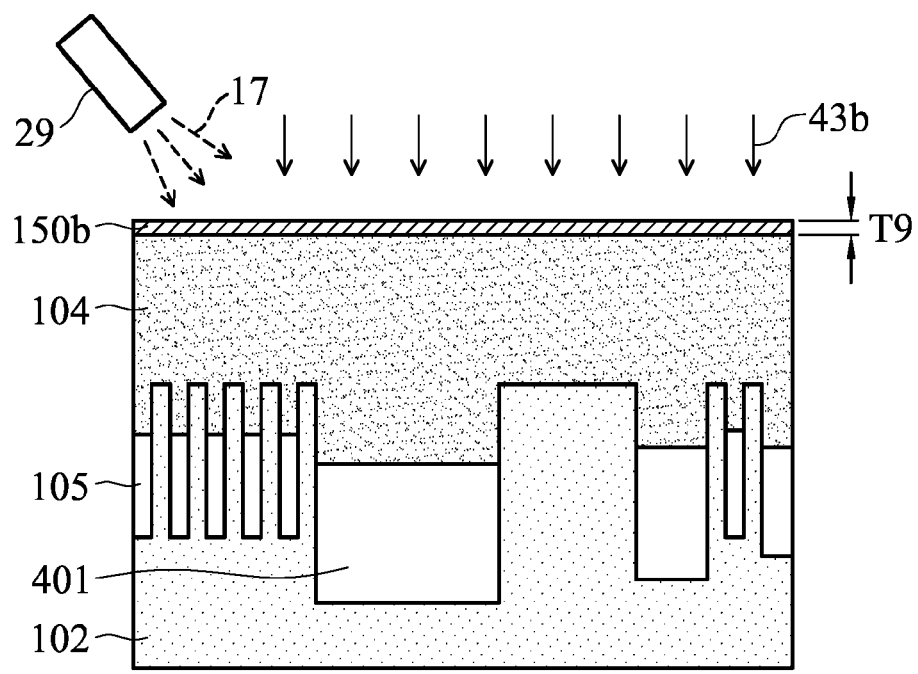

Referring to FIG. 4D, the operation 43b is continuously performed on the oxide layer 150b, and the oxidation solution 15 is replaced by the cleaning solution 17 to perform the cleaning operation. The cleaning solution 17 has been described above, and not repeated here. In some embodiments, the halide concentration is in a range from about 0.1% to about 5%. In some embodiments, the halide concentration is in a range from about 2% to about 3%.

After the cleaning operation, the oxide layer 150b may be slightly etched by the cleaning solution 17. Thus, the oxide layer 150b has a thickness T9 which is slightly smaller than the thickness T8. In some embodiments, the thickness T9 is in a range from about 10 Å to about 25 Å. Although the thickness of the oxide layer 150b is reduced to thickness T9, it is still thick enough to protect the polysilicon layer 104 from being exposed.

From the above descriptions, the thick oxide layer 150b is formed over the polysilicon layer 104 by using the oxidation solution 15 during the operation 43a and by using the cleaning solution 17 with a halide concentration less than about 5% during the operation 43b. The particle issue mentioned above is resolved or greatly improved.

Figure 5A:
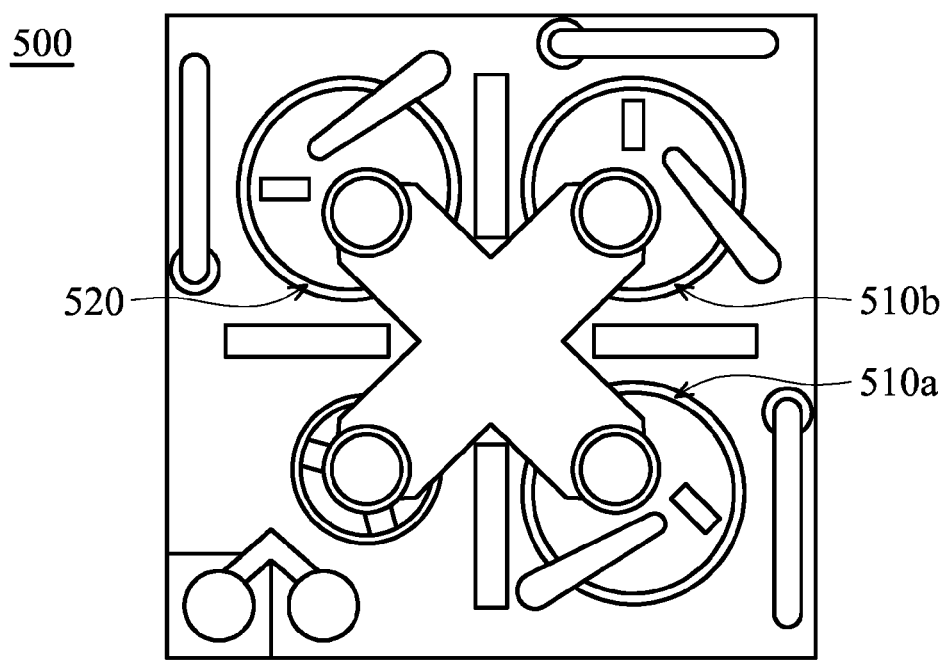
FIGS. 5A-5B show cross-sectional and schematic representations of a system for forming an oxide layer over an exposed polysilicon layer during a CMP process in accordance with some embodiments of the disclosure.

The disclosure also provides a system 500 for forming an oxide layer over an exposed polysilicon layer during a CMP process. Referring to FIG. 5A, a CMP system 500 may include a first CMP station 510a, a second CMP station 510b and a third CMP station 520.

In some embodiments, the first CMP operation 11 is performed in the first CMP station 510a, and the second CMP operations 13a, 13b are performed in the second CMP station 520.

In some other embodiments, the first CMP operations 11a, 11b are respectively performed in the first CMP station 510a and the second CMP station 510b. The first CMP station 510a is used to polish the inter-layer dielectric layer 114 by performing the first CMP operation 11a (referring to FIG. 1G) and the second CMP station 510b is used to polish the contact etch stop layer (CESL) 112 by performing the first CMP operation 11b (referring to FIG. 1H).

In some other embodiments, the first CMP station 510a is configured to polish and planarize the hard mask layer 106 (FIG. 3A). In some embodiments, the first CMP station 510a is configured to polish and planarize the polysilicon layer 104 (referring to FIG. 4B).

The third CMP station 520 is configured to perform the second CMP operations 13a, 13b, the oxidation operation and the cleaning operation to the oxide layer 150b over the polysilicon layer 104. The second CMP operations 13a, 13b are part of the buffing CMP.

In some embodiments, after removing the hard mask layer 106 on the polysilicon layer 104, the oxidation solution 15 is provided to the surface of the substrate 102 to form a thick oxide layer 150b on the polysilicon layer 104 (referring to FIGS. 3A-3B). The cleaning solution 17 with a low halide concentration is used to clean the surface of the substrate 102 with a reduced removal rate of the oxide layer 150b (referring to FIG. 3C). In some embodiments, after removing the contact etch stop layer (CESL) 112 on the polysilicon layer 104, the oxidation solution 15 is provided to the surface of the substrate 102 to form a thick oxide layer 150b on the polysilicon layer 104 (referring to FIG. 1H-1I), and the cleaning solution 17 with a low halide concentration is used to clean the surface of the substrate 102 with a reduced removal rate of the oxide layer 150b (referring to FIG. 1J).

In some other embodiments, after planarizing the polysilicon layer 104 for the FinFET device structure, the oxidation solution 15 is applied to the surface of the substrate 102 to form a thick oxide layer 150b (referring to FIG. 4B-4C), and the cleaning solution 17 with a low halide concentration is used to clean the surface of the substrate 102 with a reduced removal rate of the oxide layer 150b (referring to FIG. 4D).

Figure 5B:
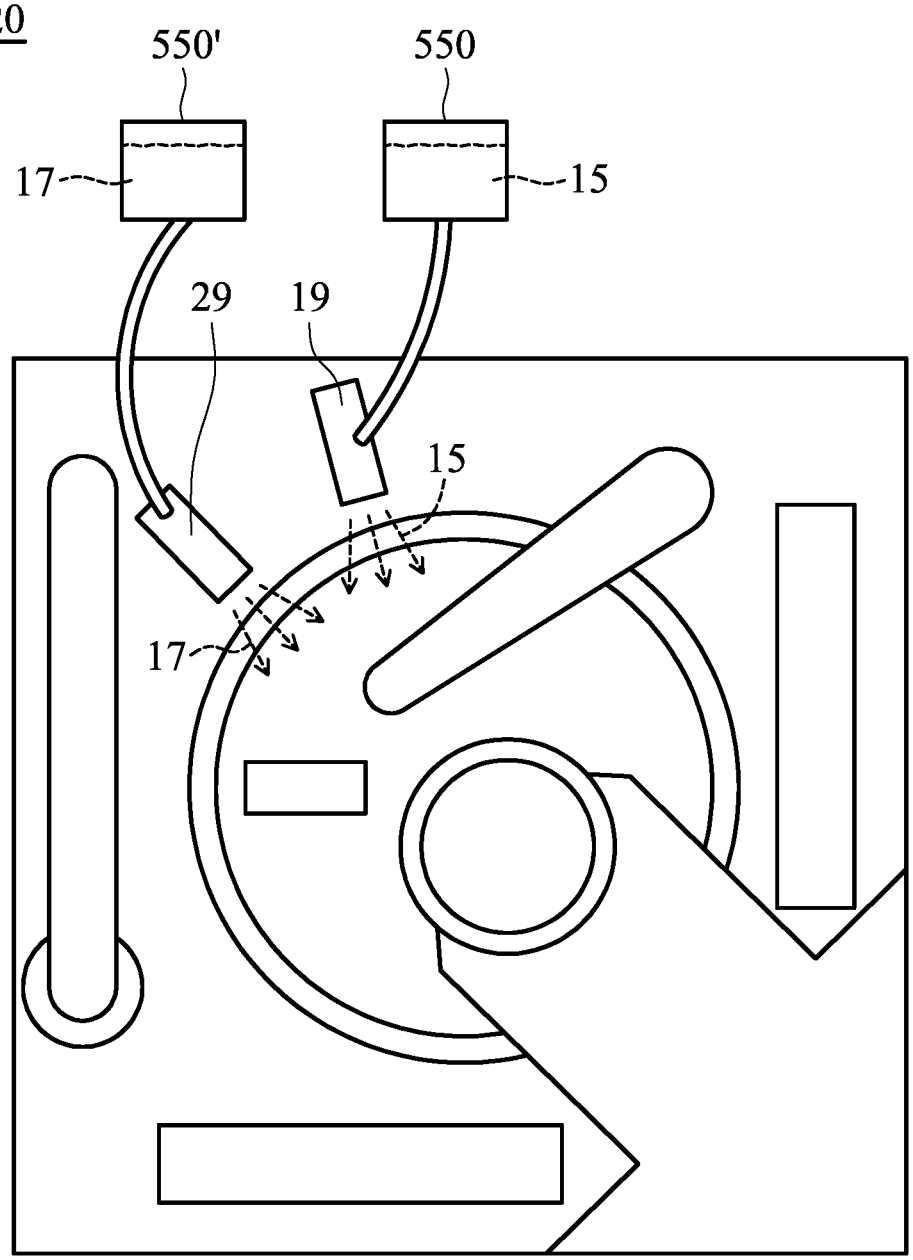

FIG. 5B shows an enlarged cross-sectional and schematic representation of the second CMP station 520. In some embodiments, the supplier 19, such as nozzle, is connected to a container 550. The supplier 19 is used to supply the oxidation solution 15 to the wafer during the buffing CMP operations 13a, 13b. In some embodiments, the supplier 29, such as nozzle, is connected to a container 550'. The supplier 29 supplies the cleaning solution 17 to the wafer.

Embodiments of mechanisms for forming an oxide layer over an exposed polysilicon layer during a CMP process are provided. A thicker oxide layer is formed by using an oxidation solution during a buffing CMP operation and also by using a cleaning solution with relatively low halide concentration to reduce the oxide removal rate. The oxide layer protects the polysilicon layer from being exposed during the CMP process. As a result, the contamination issue involving exposed polysilicon layer is resolved.

In some embodiments, a method for forming a thick oxide layer over an exposed polysilicon layer during a CMP process is provided. The method includes providing a substrate, and forming a gate structure on the substrate, and the gate structure includes a polysilicon layer. The method also includes forming an inter-layer dielectric layer (ILD) on the gate structure. The method also includes performing a CMP process to planarize the inter-layer dielectric layer (ILD) and to expose the polysilicon layer, and the CMP process includes: providing an oxidation solution to a surface of the substrate to perform an oxidation operation to form an oxide layer on the polysilicon layer; and providing a cleaning solution to the surface of the substrate to perform a cleaning operation.

In some embodiments, a method for forming a FinFET device structure is provided. The method includes providing a fin structure and forming a polysilicon layer over the fin structure. The method further includes performing a CMP process on the polysilicon layer, and the CMP process includes: providing an oxidation solution to a surface of the substrate to perform an oxidation operation to form an oxide layer on the polysilicon layer; and providing a cleaning solution to the surface of the substrate to perform a cleaning operation.

In some embodiments, a system for forming an oxide layer over an exposed polysilicon layer during a CMP process is provided. The system includes a first CMP station, and the first CMP station is configured to perform a main CMP operation. The system further includes a second CMP station, and the second CMP station is configured to perform a buffing CMP operation, and the second CMP station includes an oxidation solution supplier and a cleaning solution supplier.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an oxide layer over an exposed polysilicon layer during a chemical mechanical polishing (CMP) process, comprising:
    forming a gate structure on a substrate, wherein the gate structure comprises a polysilicon layer, and a first oxide layer is formed on the polysilicon layer;
    forming an inter-layer dielectric layer (ILD) over the gate structure; and
    performing a CMP process on the inter-layer dielectric layer (ILD), wherein the CMP process comprises:
        performing a main CMP process to planarize the inter-layer dielectric layer (ILD) and to expose the polysilicon layer;
        providing an oxidation solution to perform an oxidation reaction on the polysilicon layer and to transfer the first oxide layer to a second oxide layer, wherein the first oxide layer has a first thickness, the second oxide layer has a second thickness greater than the first thickness; and
        stopping the oxidation solution and providing a cleaning solution to a surface of the polysilicon layer to perform a cleaning operation, wherein a portion of the second oxide layer is remaining on the polysilicon layer after the cleaning process, and the remaining portion of the second oxide layer is higher than a top surface of the inter-layer dielectric layer (ILD).

2. The method as claimed in claim 1, wherein providing the oxidation solution and providing the cleaning solution are part of a buffing CMP operation of the CMP process.

3. The method as claimed in claim 1, wherein the oxidation reaction and the cleaning operation are performed in-situ in a buffing CMP station.

4. The method as claimed in claim 1, wherein forming the gate structure comprises:
    forming a dielectric layer on the substrate;
    forming the polysilicon layer on the dielectric layer;
    forming a hard mask layer on the polysilicon layer; and
    patterning the dielectric layer and the polysilicon layer to form the gate structure.

5. The method as claimed in claim 4, further comprising:
    removing the hard mask layer by another CMP process to expose the polysilicon layer after patterning the dielectric layer and the polysilicon layer, wherein another CMP process further comprises providing the oxidation solution and providing the cleaning solution.

6. The method as claimed in claim 1, further comprising:
    forming a contact etch stop layer (CESL) on the gate structure before forming the inter-layer dielectric layer (ILD).

7. The method as claimed in claim 6, wherein the CMP process also removes the contact etch stop layer (CESL).

8. The method as claimed in claim 1, wherein the oxidation solution is made of a hydrogen peroxide ($H_2O_2$) solution, hydroxyl amine ($NH_2OH$) solution, HClO, NaClO, KClO, $Ca(OCl)_2$ or combinations thereof.

9. The method as claimed in claim 1, wherein the oxidation solution is formed by supplying oxygen-containing gas into water, wherein the oxygen-containing gas is made of oxygen ($O_2$), ozone ($O_3$) or combinations thereof.

10. The method as claimed in claim 1, wherein the cleaning solution has a halide concentration in a range from about 0.1% to about 5%.

11. The method as claimed in claim 1, further comprising:
    providing another oxidation solution to the exposed polysilicon layer to perform another oxidation reaction after the cleaning operation.

12. A method for forming a FinFET device structure, comprising:
    providing a plurality of fin structures extending from and above a substrate;
    forming a dielectric layer between two adjacent fin structures;
    forming a polysilicon layer over the fin structure and the dielectric layer, wherein a first oxide layer is formed on the polysilicon layer;
    performing a CMP process on the polysilicon layer, wherein the CMP process comprises:
        performing a main CMP process to expose the polysilicon layer;
        providing an oxidation solution to a surface of the polysilicon layer to perform an oxidation reaction to transfer the first oxide layer to a second oxide layer, wherein the first oxide layer has a first thickness, the second oxide layer has a second thickness greater than the first thickness; and
        providing a cleaning solution to the surface of the polysilicon layer to perform a cleaning operation, wherein a portion of the second oxide layer is remaining on the polysilicon layer after the cleaning process, and the cleaning solution is made of a halide including HBr, HCl, NaCl, NaF or NaBr.

13. The method as claimed in claim 12, wherein providing the oxidation solution and providing the cleaning solution are part of a buffing CMP operation of the CMP process.

14. The method as claimed in claim 12, wherein the oxidation reaction and the cleaning operation are performed in-situ in a buffing CMP station.

15. The method as claimed in claim 12, wherein the oxidation solution is made of a hydrogen peroxide ($H_2O_2$) solution, hydroxyl amine ($NH_2OH$) solution, HClO, NaClO, KClO, $Ca(OCl)_2$ or combinations thereof.

16. The method as claimed in claim 12, wherein the oxidation solution is formed by supplying oxygen-containing gas into water, wherein the oxygen-containing gas is made of oxygen ($O_2$), ozone ($O_3$) or combinations thereof.

17. The method as claimed in claim 12, wherein the cleaning solution has a halide concentration in a range from about 0.1% to about 5%.

18. The method as claimed in claim 12, further comprising:
    providing another oxidation solution to the surface of the polysilicon layer to perform another oxidation reaction after the cleaning operation.

19. A method for forming an oxide layer over an exposed polysilicon layer, comprising:
    forming a polysilicon layer on a substrate;
    forming an inter-layer dielectric layer (ILD) over the polysilicon layer;

planarizing the inter-layer dielectric layer (ILD) to expose the polysilicon layer, wherein a first oxide layer is formed on the polysilicon layer;

performing an oxidation reaction on the polysilicon layer to transfer the first oxide layer to a second oxide layer, wherein the first oxide layer has a first thickness, the second oxide layer has a second thickness greater than the first thickness;

partially removing the second oxide layer to leave a remaining portion of the second oxide layer on the polysilicon layer, the remaining portion of the second oxide layer is higher than a top surface of the inter-layer dielectric layer (ILD).

20. The method as claimed in claim 19, wherein the remaining portion of the second oxide layer has a third thickness, and the second thickness is greater than the third thickness.

\* \* \* \* \*